United States Patent
Rongve et al.

(10) Patent No.: US 9,203,342 B2
(45) Date of Patent: Dec. 1, 2015

(54) SUBSEA MEASUREMENT AND MONITORING

(71) Applicant: ABB AS, Billingstad (NO)

(72) Inventors: Knut Rongve, Fyllingsdalen (NO); Jan Wiik, Oslo (NO); Tor-Eivind Moen, Nesoya (NO); Behrooz-Moghimian Hoosh, Fyllingsdalen (NO)

(73) Assignee: ABB AS, Billingstad (NO)

( * ) Notice: Subject to any disclaimer, the term of this patent is extended or adjusted under 35 U.S.C. 154(b) by 138 days.

(21) Appl. No.: 14/048,942

(22) Filed: Oct. 8, 2013

(65) Prior Publication Data

US 2014/0035504 A1 Feb. 6, 2014

Related U.S. Application Data

(63) Continuation of application No. PCT/EP2012/055143, filed on Mar. 22, 2012.

(60) Provisional application No. 61/473,364, filed on Apr. 8, 2011.

(51) Int. Cl.
| | |
|---|---|
| *H02P 31/00* | (2006.01) |
| *H02P 29/02* | (2006.01) |
| *G05B 23/02* | (2006.01) |
| *G01R 31/28* | (2006.01) |

(52) U.S. Cl.
CPC ............... *H02P 31/00* (2013.01); *G01R 31/28* (2013.01); *G05B 23/0235* (2013.01); *H02P 29/02* (2013.01)

(58) Field of Classification Search
CPC .................................. H02P 31/00; H02P 29/02
USPC ............. 318/16, 434, 474, 490, 565; 388/909
See application file for complete search history.

(56) References Cited

U.S. PATENT DOCUMENTS

| | | | | |
|---|---|---|---|---|
| 7,721,822 | B2 * | 5/2010 | Krueger et al. | ................ 175/57 |
| 2004/0262008 | A1 | 12/2004 | Deans et al. | |
| 2009/0044938 | A1 | 2/2009 | Crossley et al. | |
| 2010/0299119 | A1 | 11/2010 | Erikson et al. | |
| 2011/0071966 | A1 | 3/2011 | Holley et al. | |
| 2013/0182620 | A1 * | 7/2013 | Chaffee et al. | ................ 370/310 |

OTHER PUBLICATIONS

International Preliminary Report on Patentability Application No. PCT/EP2012/055143 Completed: Jul. 5, 2013 17 pages.
Search Report and Written Opinion of the International Searching Authority Application No. PCT/EP2012/055143 Completed: Jul. 26, 2012; Malign Date: Aug. 7, 2012 10 pages.
Written Opinion of the International Preliminary Examining Authority Application No. PCT/EP2012/055143 Issued: Mar. 4, 2013 7 pages.

* cited by examiner

*Primary Examiner* — Bentsu Ro
(74) *Attorney, Agent, or Firm* — Whitmyer IP Group LLC

(57) ABSTRACT

A method for monitoring at least one subsea electric machine supplied by a system for electric power transmission. The system has a power supply, a controller and an AC power line connecting the at least one machine with the power supply. The method includes the steps of: receiving at the controller, high speed data from at least one subsea sensor arranged between the subsea side of the AC power line and the at least one subsea electric machine, wherein the high speed data includes measurements of an electrical parameter for the at least one machine; and comparing the one or more measurements to a predetermined value. A system for electric power transmission arranged for operating at least one subsea load or electric machine is also described.

25 Claims, 5 Drawing Sheets

SUBSEA MEASUREMENT AND MONITORING

FIELD OF THE INVENTION

The invention relates to the field of measurement and monitoring of undersea equipment.

BACKGROUND OF THE INVENTION

When feeding AC power through long cables in transmission systems feeding an electrical load (machines/or other loads), the voltage at consumer end will be heavily influenced by electrical load drawn by the consumer. An example of such a long cable is a cable some kilometers or miles in length connecting a power supply on land to a transformer or to a motor of a pump installed out to sea. In the field of Oil and Gas exploration and production, such loads or machines may be for example be mounted on the seabed tens of kilometers away from land or a topside platform. Electrical equipment such as a subsea multiphase pump or pressure booster pump or a subsea compressor used in Oil and Gas production or transfer installations may be operated underwater, e.g., on the seabed, at depths 1000 meters, or more.

Operating such subsea equipment presents challenges. It is difficult to plan for maintenance of subsea equipment due to an often inaccurate estimate of equipment condition and performance. In the case of a subsea component failure, it is difficult to accurately identify which component has failed. The dynamic performance of the power supply system and loads might change with changing ambient conditions, ageing, various points of operation (frequency, power levels, etc.). It is then difficult for the power supply onshore/platform to be adjusted based on only local measurements, on land or topside. Furthermore, it is difficult to assess capacity limitations of equipment as the information or estimate of the power consumed by the subsea motor is not very accurate, which lack of accuracy normally results in a less optimal planning of production.

The measurement and monitoring of subsea electric machines and the power supplied thereto are critical for the proper functioning of subsea systems where failure of subsea electric machines can be catastrophic. The large distances, remoteness of equipment and difficulties in accessing the subsea electric machines presents unique challenges.

SUMMARY OF THE INVENTION

The aim of the present invention is to remedy one or more of the above mentioned problems.

In one advantageous embodiment of the invention, a method for monitoring at least one subsea electric machine supplied by a system for electric power transmission is provided, the system having a power supply, a controller and an AC power line connecting the at least one machine with the power supply, the method comprising the steps of: receiving at the controller, high speed data from at least one subsea sensor arranged between the subsea side of the AC power line and the at least one subsea electric machine, wherein the high speed data includes measurements of an electrical parameter for the at least one machine; and comparing the one or more measurements to a predetermined value.

In another advantageous embodiment of the invention, a system for electric power transmission arranged for operating at least one subsea electric machine is provided comprising: a power supply; a controller; and an AC power line connecting said at least one machine with said power supply. The system is provided such that the controller receives high speed data from a subsea sensor positioned between the subsea side of the AC power line and the at least one subsea electric machine for measuring an electrical parameter for the at least one subsea electric machine; and the controller compares the one or more measurements to a predetermined value.

For this application the following terms and definitions shall apply:

The term "data" as used herein means any indicia, signals, marks, symbols, domains, symbol sets, representations, and any other physical form or forms representing information, whether permanent or temporary, whether visible, audible, acoustic, electric, magnetic, electromagnetic or otherwise manifested. The term "data" as used to represent predetermined information in one physical form shall be deemed to encompass any and all representations of the same predetermined information in a different physical form or forms.

The term "network" as used herein includes both networks and internetworks of all kinds, including the Internet, and is not limited to any particular network or inter-network.

The terms "coupled", "coupled to", "coupled with", "connected", "connected to", and "connected with" as used herein each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, and/or (c) a functional relationship in which the operation of any one or more devices, apparatus, files, programs, media, components, networks, systems, subsystems, or means depends, in whole or in part, on the operation of any one or more others thereof.

The terms "process" and "processing" as used herein each mean an action or a series of actions including, for example, but not limited to, the continuous or non-continuous, synchronous or asynchronous, direction of data, modification of data, formatting and/or conversion of data, tagging or annotation of data, measurement, comparison and/or review of data, and may or may not comprise a program.

Other objects of the invention and its particular features and advantages will become more apparent from consideration of the following drawings and accompanying detailed description.

DETAILED DESCRIPTION OF THE INVENTION

Figure 1:
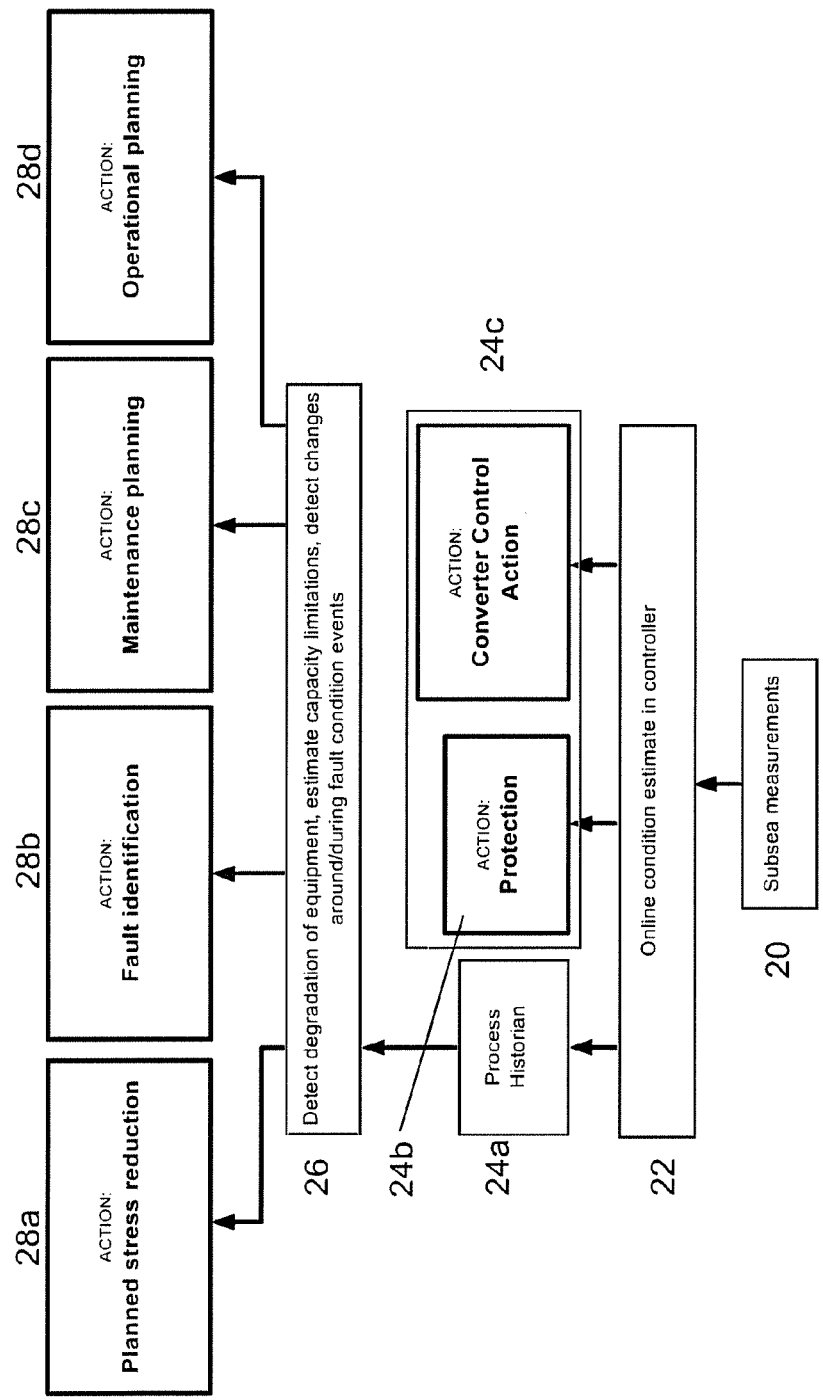
FIG. 1 is a flow diagram according to one advantageous embodiment of the invention.

Referring now to the drawings, the system focuses on a system and method for dealing with the following issues/situations/equipment including:

1. Topside (Onshore or platform) power supply system feeding subsea loads through cables with AC current (step-out configuration as one example);

2. High speed measurement of subsea electrical parameters (primarily current and voltage);

3. Transmission of measured data through a high speed communication link to topside;

4. Manipulation of measured high resolution data to say something about equipment or system condition/performance.

The system requirements may further include/address:

5. Presenting these data in operator or condition/performance workplace including generation of alarm/events (example shown in FIG. 5).

6. Generate a control action based on manipulated data describing equipment or system condition.

7. Synchronizing and comparing data of subsea measurement and topside measurement to provide more accurate information about system condition and power supply control performance.

Figure 4:
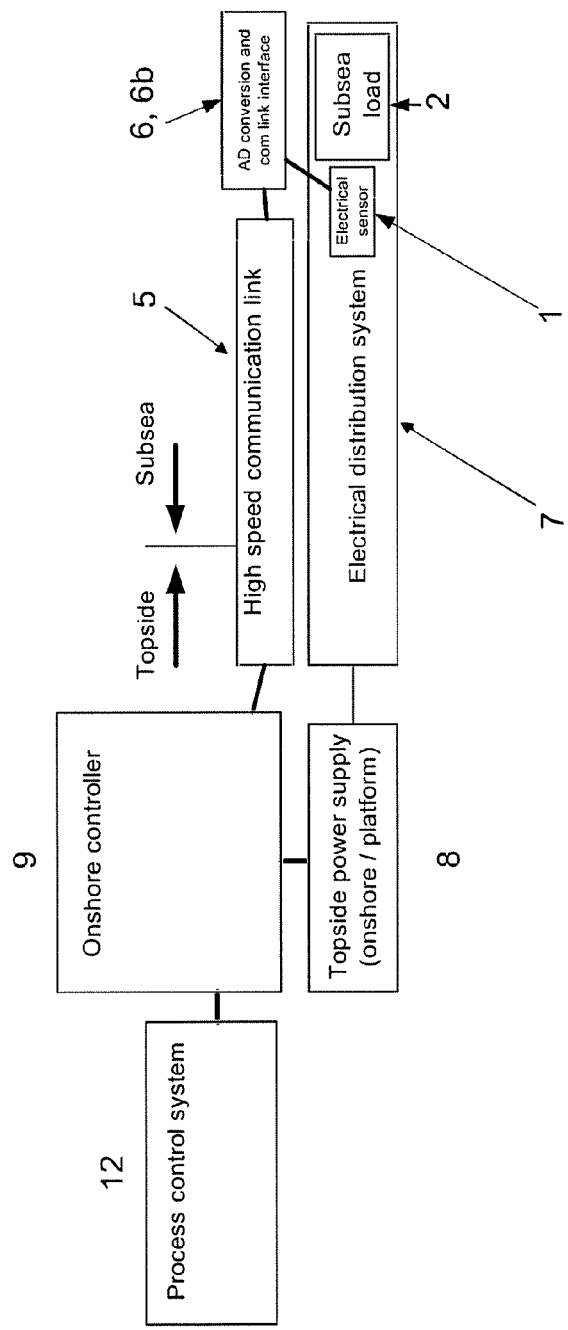
FIG. 4 is a block diagram according to the advantageous embodiment of FIG. 2.

A general view of the base invention is described, for example, in FIG. 4. The monitoring can provide the following actions, as also illustrated in FIG. 1:

A) Power supply control action:
  to protect equipment by quick actions when faults are detected;
  operate to reduce stress due to degrading performance and wish of safe operation until next maintenance stop;
  Measurements for feedback to optimize control dynamics, for instance feedback of a detailed estimate of shaft power may be used to control.

B) Fault corrective action due to fault location information and identification of problem (the condition monitoring information generated in controller may be used to indicate location and type of problem).

C) Maintenance planning action, the condition and performance monitoring can be used to predict degradation development and then be used for planning of maintenance.

D) Operational planning action, the condition information from the system can be used to improve the planning of operations by in more detail knowing the capacity limitations of the system.

Figure 5:
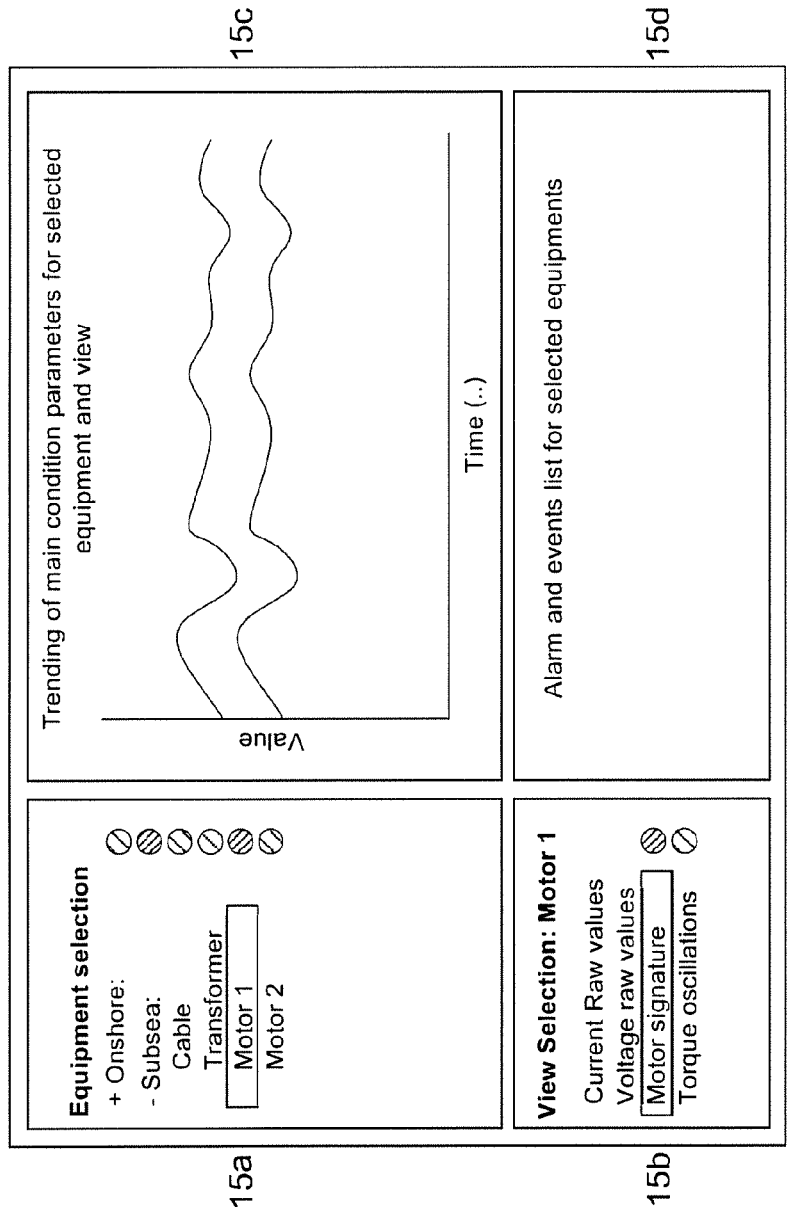
FIG. 5 is an illustration of an operator workplace for online follow up of condition changes according to the advantageous embodiment of FIG. 2.

As illustrated in FIG. 4, the Topside portion of the system may include a Process Control System having a controller communication interface that may provide for historical trending, generation of alarms/events based on equipment condition and/or display of condition/performance information in an operator workspace (FIG. 5). The Process Control System is illustrated coupled to an Onshore Controller allowing for high speed data manipulation for extracting equipment/system condition and performance information. The Onshore Controller may be provided with a subsea communication interface, a control network interface and a control interface for power supply control for taking control action based on condition estimations. The Onshore Controller is illustrated coupled to Topside Power Supply (onshore/platform) where virtually any type of AC power supply may be used where a control action can be performed including, for example, converter power supply and/or directly supplied from local grid with a controlled circuit breaker. The power supply control can be adjusted based on the system condition evaluation in the Onshore Controller.

As further illustrated in FIG. 4, a High-Speed Communication Link and an Electrical Distribution System extend from the Topside Onshore Controller and Topside Power Supply respectively to the Subsea portion of the system. The High-Speed Communication Link can comprise virtually any broadband link, including, for example, an optical cable. The Electrical Distribution System may include, for example, an on-shore step-up transformer, a subsea step-down transformer and a switchgear. It is understood that the High-Speed Communication Link and Electrical Distribution System extend long distances (sometimes many kilometers) from Topside to Subsea. It is contemplated that both the High-Speed Communication Link and Electrical Distribution System may comprise a single long subsea cable with integrated optical communication and electrical transmission.

The Subsea portion of the system may further include an A/D converter and communication link interface coupled to the High-Speed Communication Link. Additionally, the Electrical Distribution System may include at least one electrical sensor, which in one advantageous embodiment is coupled to the communication link interface. The at least one electrical sensor may include, for example, a voltage or current sensor that may be placed at various locations on the Electrical Distribution System and may further comprise multiple sensors placed at different locations on the Electrical Distribution System. The current and/or voltage sensors may be integrated in a topside transformer and/or integrated in a subsea transformer.

The Electrical Distribution System is used to feed a Subsea Load, which may comprise any powered subsea equipment, including, for example, but not limited to: a single induction motor, multiple induction motors, etc. It is understood that the electrical sensor(s) may monitor the Subsea Load and/or any portion of the Electrical Distribution System, which data/information may be transmitted via the A/D converter and communication link interface coupled to the High-Speed Communication Link to the Topside portion of the system.

Figure 2:
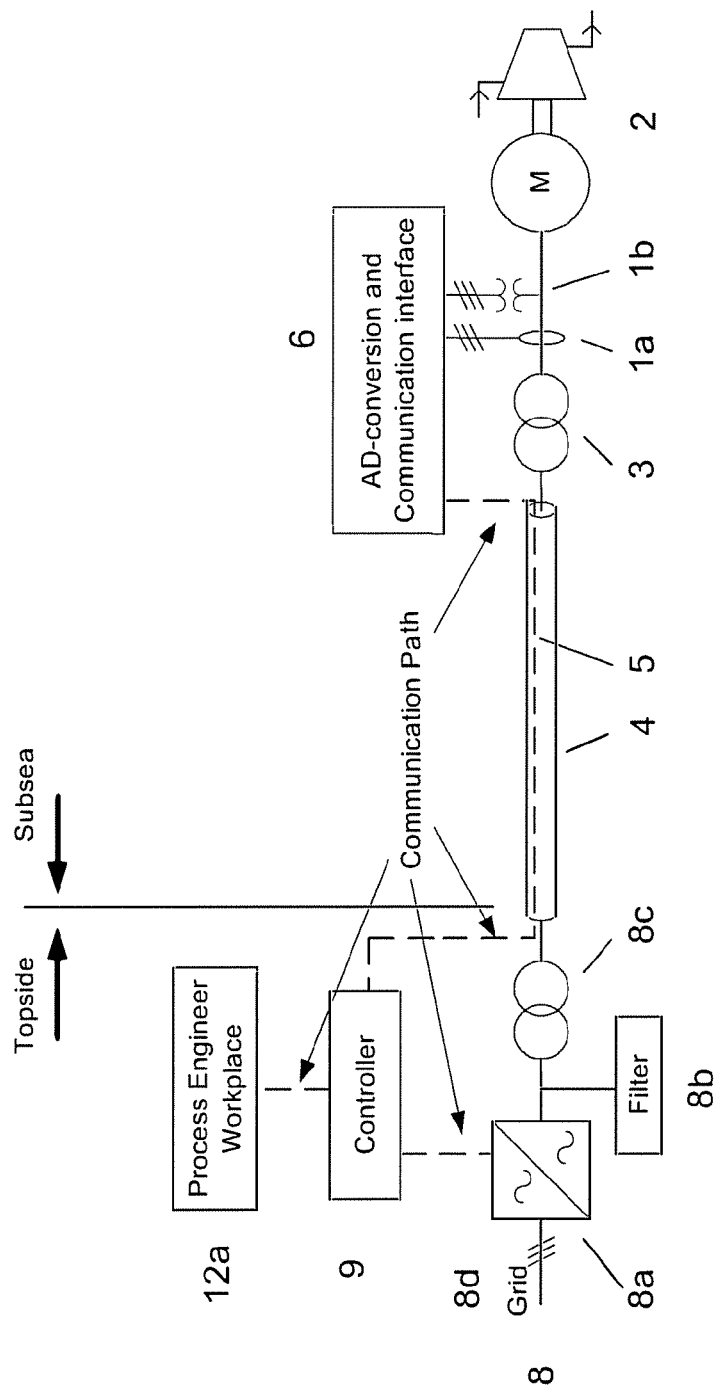
FIG. 2 is a block diagram of an advantageous embodiment of the invention.

The hardware infrastructure for one implementation of the invention is illustrated in FIG. 2 and includes:

1. Electrical configuration with topside (onshore/platform) converter, step-up transformer, long cable, step-down transformer and motor connected to pump or compressor.

2. Sensing of voltage and current subsea using voltage transformers (VTs) and current transformers (CTs).

3. Subsea 10 module converting the analog signals to digital signals.

4. Sending of digital signals from 10 module through optical cables that are a part of the subsea power supply cable. The optical signals are facilitated to enable transfer over long distances. In one embodiment, the communication speed will preferably be in the area of 5 Mb/s.

5. Receiving the data in a top side controller, where high speed manipulation of the data is performed for facilitating condition and performance monitoring applications as well as protective actions.

Figure 3:
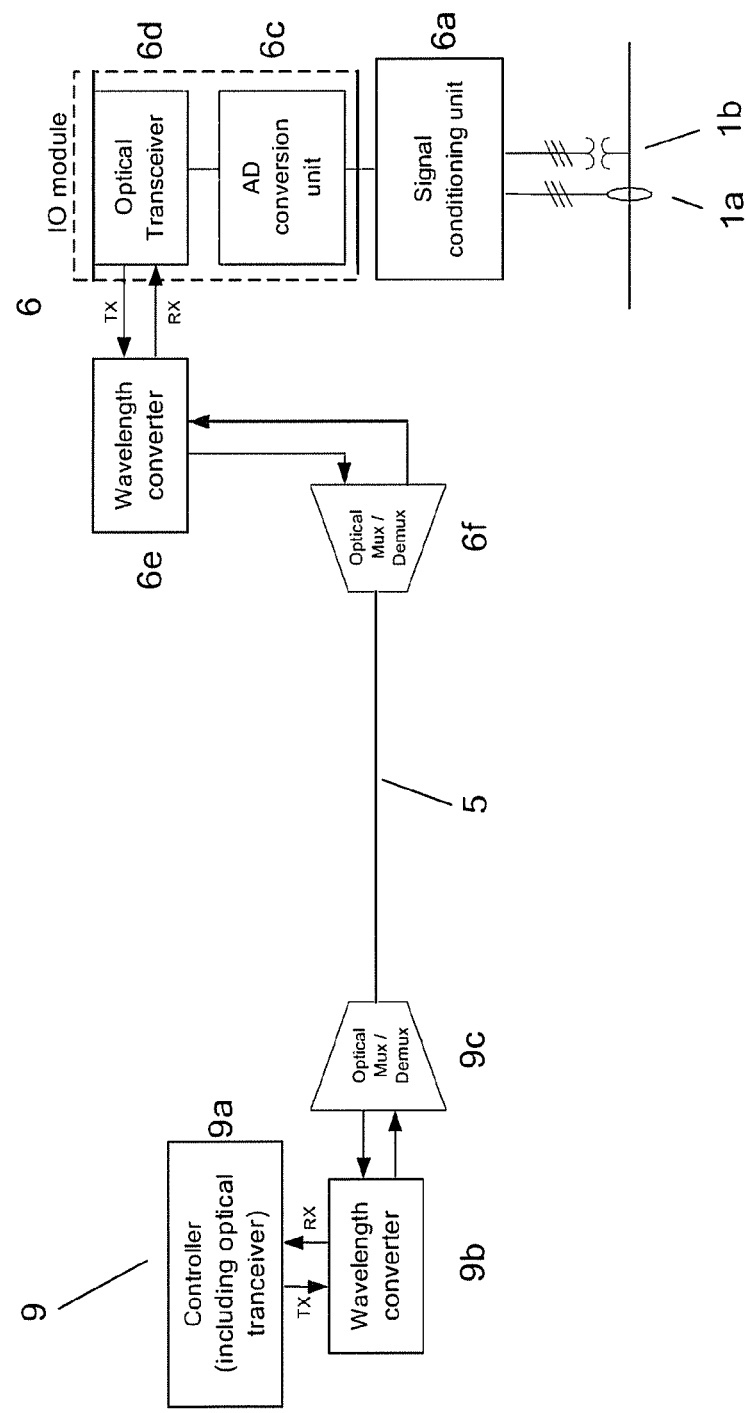
FIG. 3 is a block diagram of the advantageous embodiment according to FIG. 2 further detailing one implementation of the communication infrastructure.

FIG. 3 is a detailed description of one possible implementation of the communication infrastructure.

As per FIG. 3, the main signal flow is from subsea sensor to onshore controller, but the infrastructure facilitates also data flow the other way. Signal conditioning unit: Voltage and current transformers typically outputs signals in the form of a 100V range voltage and 1A range current. These signals must be conditioned in order to meet the requirement of AD conversion.

AD conversion unit (part of an 10 module): AD converter converts the analog signal to a digital signal at a configured rate to be stored in an allocated memory.

Optical transceiver: can transmit the AD conversion results to an optical communication channel (e.g., it can also receive data from the optical fiber).

Wavelength converter: where necessary, is required to change the wavelength of the output of the optical transceiver in order to enable transmission over greater distances.

Offshore optical multiplexer/demultiplexer enables the combination of several wavelengths on a single optical fiber. Several 10 modules as well as sending and receiving can then be applied to the same optical fiber.

Single mode optical fiber: are used (instead of multi-mode fiber) to enable transmission over greater distances.

Onshore optical multiplexer/demultiplexer receives the signals on the optical fiber and separates them based on wavelength.

Controller receives the optical signal from the wavelength converter (and can also send optical signal).

Several examples of data manipulations that may be performed in the controller are provided for illustrative purposes below.

Example 1

Motor signature analysis is well known for detection of motor failures such as bearing failures. Online motor signature analysis is proposed to be performed in controller for continuous tracking of motor condition and development. Motor signature analysis is based on high resolution current measurements of current injected to motor. This can be used both for (a) taking immediate control action (or protection action) by looking for changes or comparing with given limits, or (b) through a process historian, where the development over time is studied, degradations are identified, and decision for maintenance is taken, or lowering of the load of the given motor is performed to enable operation until next planned maintenance.

Example 2

Electrical motor power, motor torque, motor speed and/or voltage/current space vector speed may be estimated in the controller for the analysis of motor condition dynamics. High dynamic performance of an electrical torque/power/speed estimate can be achieved by having three voltage measurements and three current measurements for the given motor (alternatively two of each if no zero sequence component is assumed). Various methods of estimation can be performed with e.g. evaluation of instantaneous active power given by, $$p = v_a i_a + v_b i_b + v_c i_c \quad \text{Formula 1}$$

where p is active power, $v_a$ to $v_c$ are phase voltages and $i_a$ to $i_c$ are phase currents. There are also other alternative equations well known for an engineer trained in the field.

Evaluation of motor torque for an induction motor can be evaluated by using the common equation for direct torque control (DTC) as given by:

$$T_{em} = \frac{p}{2} \text{Im}(\vec{\lambda}_s \, \vec{i}_s^{\,conj}), \quad \text{Formula 2}$$

where $T_{em}$ is the estimated electrical torque, p is the pole number, Im the imaginary operator, $\vec{\lambda}_s$ is the stator flux space vector estimated based on the stator voltages and currents, $\vec{i}_s$ is the stator current space vector. Also for the torque estimation, there are other equations that also are well known for an engineer trained in the field.

The mechanical motor speed of an induction motor can be estimated by:

$$\omega_{meck} = \omega_r - \omega_{slip}, \quad \text{Formula 3}$$

where $\omega_r$ is the speed of the rotor flux estimated from stator voltages and currents as well as motor parameters (well known for an engineer trained in the field), $\omega_{slip}$ is the slip speed also estimated based on stator measurements and motor parameters.

Furthermore, the voltage and/or current space vector speed can be estimated by:

$$\omega_{spacevector} = \frac{\Delta \theta}{T_s}, \quad \text{Formula 4}$$

where $\Delta \theta$ is the space vector angle difference between two samples and $T_s$ is the sampling interval. Other methods well known for an engineer trained in the field, such as phase locked loops (PLL) can also be applied.

The electrical motor power/torque or speed estimate can be used for e.g. evaluation of motor speed/torque/power variations spectra for indication of process instabilities or torsional oscillation problems. This information can both be used for direct control/protection action when above a given level, or through a process historian, be used to estimate changes/degradations to indicate need for maintenance, control tuning or changes to operating set point.

Example 3

Extremely accurate steady state shaft power is estimated based on current and voltage sensors for a given motor. The accuracy is achieved by correcting for known non-linearities in current and voltage transformers and proper calibration. The accurate shaft power estimate will give a good indication of the actual operation condition of the equipment and can be used together with process data to evaluate performance and estimate capacity limits of rotating equipment.

Example 4

Impedance values seen at various points of measurement or in-between two points of measurement may be estimated in the controller. An impedance value can be evaluated based on having one current and one voltage value with high resolution. (A) For a case with one point of measurement, both current and voltage amplitude (and optionally phase shift) of a given harmonic frequency (or set of frequencies) are evaluated continuously. The impedance will then be given by $$Z = \frac{V e^{j \theta_v}}{I e^{j \theta_i}}, \quad \text{Formula 5}$$

where V is the voltage amplitude, I is the current amplitude, $\theta_v$ is the voltage phase angle and $\theta_i$ is current phase angle.

Typically, this will represent the impedance for a load or subsystem. (B) Voltages and currents at two different points of measurements (e.g. across a subsea transformer), where the impedance between the two points of measurements are evaluated. A tracking of e.g. the transformer impedance can then be achieved.

The impedance estimates are either used to trigger control/protection action when exceeding certain limits or by feeding data through a process historian, being used to indicate changes/degradations and giving input to maintenance planning or for control tuning. Analysis of changes in e.g. a transformer condition can then be achieved.

Example 5

Storage of high resolution sensor data for transfer to e.g. process historian or operator workplace shall be performed during relevant transient events such as protection events, startup, shutdown, and so on. High resolution data shall be stored in ring buffer or equivalent in the controller, and be saved and transferred to e.g. process historian during relevant events. The stored data can after a protection event be analyzed to find cause of error, or to compare various startup/shutdown sequences.

Example 6

Real time evaluation of voltage quality (fundamental harmonic amplitude, root mean square (rms), total harmonic distortion (THD) and harmonic content, unbalance (presence of negative and zero sequence components in voltage) is performed in controller. If above/below preset values for a given period of time, protection action is initiated. Also, data is sent to process historian for trending and analysis of changes/degradations which again can result in useful actions such as control tuning for the improvement of voltage quality.

Example 7

Real-time evaluation of current unbalance performed in the controller. Same useful actions as discussed above.

Discussion regarding core of invention and possible extensions.

Description of Power Supply Configuration:

The supply of an induction motor from an onshore or platform converter through an onshore/platform step-up transformer, long subsea cable, subsea step-down transformer is contemplated. However, it is contemplated that additional and more complex subsea distribution systems are applicable to the present inventive concept. A general definition of the electrical distribution system would be a power supply from onshore or platform (not limiting the system to including a converter or step-out transformer but including these options), go at least through one long cable, (including possibly a subsea step-down transformer in the end) and supplying at least one subsea load.

Description of Measurement System:

Two voltage sensors and two current sensors on the low voltage side of the step-down transformer are contemplated. However, it is understood that only one sensor may be utilized. Differing placements of the sensors, such as on the high voltage side of the step-down transformer, may also be used.

Extension of More Points of Measurements:

The addition of electrical measurements in various locations in the system is still further contemplated. For instance, current and voltage measurements on the high voltage side of subsea transformer, current and voltage measurements on the high voltage side of the topside transformer, current and voltage sensors inside the drive, current and voltage sensors for a multiple of subsea loads may be advantageous.

The invention is also directed to a method of synchronizing all these measurements discussed above by accounting for transfer delays in the communication system, such that samples from different locations may advantageously be compared in real time.

It is still further contemplated that an extension with other types of measurements may effectively be used, for example, vibration sensors, temperature sensors, etc.

It is still further understood that the manipulation of data could be performed subsea and then, only condition data would then be sent topside, although this approach includes a number of challenges and trade-offs.

Although the invention has been described with reference to a particular arrangement of parts, features and the like, these are not intended to exhaust all possible arrangements or features, and indeed many other modifications and variations will be ascertainable to those of skill in the art.

FIG. 1 shows a flow diagram in which Subsea measurements 20 (+optional combination with onshore), lead to the step of Online condition estimate 22 in controller 9 (various types of condition estimates).

Online condition estimate leads to two action steps,

ACTION: Protection 24b (triggered by changes, or comparison with expected levels of condition estimates); and ACTION: Converter Control Action 24c (update of control model based on real measurements, feedback of actual measured power, damping of oscillations).

The step of Process Historian 24a (Storage of condition estimates, as well as raw data in periods of events) leads to a further process step:

Detect degradation of equipment 26, estimate capacity limitations, detect changes around/during fault condition events.

This step leads to four action steps:

ACTION: Planned stress reduction 28a

Reduce stress on equipment due to degrading performance and wish of safe operation until next maintenance stop ACTION: Fault identification 28b Identify the reason for system failure and the location of failed component. Reduce downtime.

ACTION: Maintenance planning 28c

Improved planning of maintenance based on detailed knowledge of changes and degradations ACTION: Operational planning 28d Improved operational planning with detailed knowledge of equipment capacity limitations FIG. 2 shows a block diagram of hardware infrastructure for one implementation of the invention, which shows Topside:

Process Engineer Workplace 12a,
Controller 9,
Grid 8d,
Filter 8b,
then on the Subsea side:
the Communication Path 5, long cable 4 including optical communication
AD-conversion and Communication interface 6,
Motor, load 2

FIG. 3 shows a block diagram of the advantageous embodiment according to FIG. 2 further detailing one implementation of the communication infrastructure. It shows on the Topside Controller 9 (including optical transceiver 9a),
Wavelength converter 9b,
Optical Mux/Demux 9c,
Single mode optical fiber 5,
and on the Subsea side
Optical Mux/Demux 6f,
Wavelength converter 6e,
an IO module 6 with Optical Transceiver 6d, AD conversion unit 6c and Signal conditioning unit, 6a.
Voltage Transformer 1b,
Current Transformer 1a, FIG. 4 shows a block diagram according to the advantageous embodiment of FIG. 2, with on the Topside 1. Controller communication interface
2. Historical trending 24a 3. Generation of alarms/events 24b, 24c based on equipment condition 22, 15b
4. Display of condition/performance info in operator workplace (FIG. 5, 15).

Onshore Controller 9
1. High speed data manipulation for extracting equipment/system condition 26, 15d and performance info.
2. subsea communication interface 9a
3. control network interface—operator station 15/historian 24a/ . . . .
4. Control interface towards power supply 8 control for taking control action based on condition estimations.

Topside Power Supply
(Onshore/Platform)
Any type of AC power supply 8d where a control action can be performed such as:
1. Converter power supply 8a
2. Directly supplied from local grid 8d with controlled circuit breaker.

Power supply control can be adjusted based on system condition evaluation 26 in onshore controller 9.

On the Subsea side the diagram shows
High speed communication link 5 (optical, . . . )
AD conversion and com link interface 6, 6b
Electrical Distribution System 7
Including at least one long subsea cable 4 with integrated optical communication 5, at least one subsea electrical consumer 2, and optionally other electrical equipments such as:
1. onshore step-up transformer 8c
2. subsea step-down transformer 3
3. switch-gear Electrical Sensor
Voltage 1b and/or current 1a as base.
Various placements
Multiple of placement (and sensors)

Subsea Load 2
1. Single Induction motor (IM)
2. Multiple induction motors
3. Other loads.

FIG. 5 shows an illustration of an operator workplace 15 for online follow up of condition changes, with
Equipment selection 15a,
Selected equipment condition 15b,
Trends for selected equipment 15c,
Alarms and events for selected equipment 15d.

What is claimed is:

1. A method for monitoring at least one subsea electric machine supplied by a system for electric power transmission, the system having power supply, a controller and an AC power line connecting the at least one machine with the power supply, the method comprising the steps of:
receiving at the controller, data from at least one subsea sensor arranged between the subsea side of the AC power line and the at least one subsea electric machine, a data communication link comprising an optical cable connecting said at least one sensor with said controller, an A/D conversion unit positioned at the subsea side of the data communication link for converting analogue data to digital data from at least one sensor prior to transmission of the data, an optical transceiver transmitting AD conversion results to the optical cable, a wavelength converter to change the wavelength of the output of the optical transceiver, and an offshore optical multiplexer/demultiplexer which enables the combination of several wavelengths, wherein the data includes measurements of an electrical parameter for the at least one machine; and
comparing the one or more measurements to a predetermined value.

2. The method according to claim 1, further comprising the steps of:
examining measured data from a subsea sensor; and
calculating an estimate of a motor parameter selected from the group consisting of: motor power, motor torque, motor speed, voltage/current space vector speed.

3. The method according to claim 1, further comprising the steps of:
examining measured data from a subsea sensor; and
calculating an estimate of a power quality parameter selected from the group consisting of: harmonic content of various frequencies, total harmonic distortion (THO), degree of unbalance (negative or zero sequence) and root mean square (rms).

4. The method according to claim 1, further comprising the steps of:
examining measured data from a subsea sensor; and
generating an event or alarm when a change in the value of the measured electrical parameter exceeds a predetermined setpoint.

5. The method according to claim 1, further comprising the steps of:
examining measured data from a subsea sensor; and
generating an event or alarm when a change in the value of the measured electrical parameter over a time period exceeds a predetermined set point or predetermined value.

6. The method according to claim 1, further comprising the steps of:
examining measured data from a subsea sensor; and
generating an estimate of torque or power value for the at least one subsea electric machine.

7. The method according to claim 1, further comprising the step of comparing an estimate of torque or power for the at least one subsea electric machine derived measured data from a subsea sensor with a topside measurement or a current setpoint value for power and/or torque.

8. The method according to claim 1, further comprising the step of estimating a motor parameter for the at least one subsea electric motor based on at least two voltage measurements and two current measurements for the subsea electric motor.

9. The method according to claim 1, further comprising the steps of:
measuring current and voltage topside;
measuring current and voltage from a subsea sensor; and
estimating a subsea measurement of the characteristic impedance between the two measurement locations.

10. The method according to claim 1, further comprising the steps of:
comparing measured data from a subsea sensor with power data topside; and
generating an event or alarm when a change in the value of the measured electrical parameter exceeds a predetermined setpoint.

11. The method according to claim 1, further comprising the steps of:
comparing measured data from a subsea sensor with power data topside; and generating a control action to control electrical power supplied to one or more electrical loads when a change in the value of the measured electrical parameter exceeds a predetermined setpoint.

12. The method according to claim 1, further comprising the steps of:
comparing measured data from a subsea sensor; and
generating a signal for a maintenance action when a change in the value of the measured electrical parameter exceeds a predetermined setpoint.

13. The method according to claim 1, further comprising the steps of:
examining measured data from a subsea sensor; and
estimating a condition of the at least one subsea electric machine.

14. A method according to claim 1 further comprising the steps of: converting analogue data to digital data from at least one sensor prior to transmission of the data in the A/D conversion unit positioned at the subsea side of the data communication link.

15. A system for electric power transmission arranged for operating at least one subsea electric machine comprising
a power supply
a controller;
an AC power line connecting said at least one machine with said power supply;
a data communication link comprising an optical cable;
an A/D conversion unit;
wherein said controller receives data from a subsea sensor positioned between the subsea side of said AC power line and said at least one subsea electric machine for measuring an electrical parameter for the at least one subsea electric machine the data communication link connecting said at least one sensor with said controller, wherein the A/D conversion unit is positioned at the subsea side of the data communication link for converting analogue data to digital data from at least one sensor prior to transmission of the data; the system further comprising an optical transceiver transmitting AD conversion results to the optical cable, a wavelength converter to change the wavelength of the output of the optical transceiver, and an offshore optical multiplexer/demultiplexer which enables the combination of several wavelengths, and
wherein said controller compares the one or more measurements to a predetermined value.

16. The system according to claim 15, wherein said controller comprises an interface for handling data communication from at least one subsea sensor.

17. The system according to claim 15, further comprising at least one transformer comprising at least one integrated sensor or transformer for current and/or voltage measurement.

18. The system according to claim 15, further comprising sensors for current and voltage measurements located on the high voltage side of a subsea transformer.

19. The system according to claim 15, further comprising sensors for current and voltage measurements measured on the high voltage side of the topside transformer.

20. The system according to claim 15, further comprising sensors for current and voltage measurements inside the drive.

21. The system according to claim 15, further comprising sensors for current and voltage measurements for a plurality of subsea loads.

22. The system according to claim 15, wherein the at least one subsea electric machine is connected to a subsea power distribution system supplied by the AC power line.

23. The system according to claim 15, further comprising a step up transformer on a topside of the AC power line and a step down transformer positioned between said AC power line and said at least one subsea electric machine.

24. The system according to claim 15, wherein said controller provides measurement data to an operator workstation for supervision of the system.

25. The system according to claim 15, wherein said controller provides measurement data to an operator workstation for historical trending, generation of alarms/events based on equipment condition and/or display of condition/performance information in an operator workspace.

* * * * *